(12) United States Patent
Shang et al.

(10) Patent No.: US 11,451,219 B2
(45) Date of Patent: Sep. 20, 2022

(54) DELAY CIRCUIT AND DELAY STRUCTURE

(71) Applicant: CHANGXIN MEMORY TECHNOLOGIES, INC., Hefei (CN)

(72) Inventors: Weibing Shang, Hefei (CN); Anping Qiu, Hefei (CN); Chan Chen, Hefei (CN); Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/405,110

(22) Filed: Aug. 18, 2021

(65) Prior Publication Data

US 2022/0094344 A1  Mar. 24, 2022

Related U.S. Application Data

(63) Continuation of application No. PCT/CN2021/097593, filed on Jun. 1, 2021.

(30) Foreign Application Priority Data

Sep. 18, 2020  (CN) ........................ 202010985337.8

(51) Int. Cl.
*H03K 5/134* (2014.01)
*H03K 5/00* (2006.01)

(52) U.S. Cl.
CPC ... *H03K 5/134* (2014.07); *H03K 2005/00123* (2013.01); *H03K 2005/00195* (2013.01)

(58) Field of Classification Search
CPC ......... H03K 5/134; H03K 2005/00123; H03K 2005/00195
USPC ...................................................... 327/281
See application file for complete search history.

(56) References Cited

U.S. PATENT DOCUMENTS

| | | | |
|---|---|---|---|
| 5,051,630 A | 9/1991 | Kogan | |
| 5,081,380 A | 1/1992 | Chen | |
| 5,841,296 A * | 11/1998 | Churcher | H03K 5/133 326/44 |
| 6,242,954 B1 * | 6/2001 | Taniguchi | H03L 7/0814 327/158 |
| 6,259,330 B1 * | 7/2001 | Arai | H03L 7/0997 331/177 R |

(Continued)

FOREIGN PATENT DOCUMENTS

| | | |
|---|---|---|
| CN | 101110582 A | 1/2008 |
| CN | 101472370 A | 7/2009 |

(Continued)

OTHER PUBLICATIONS

Supplementary European Search Report in European application No. 21777918.0, dated Aug. 4, 2022, 10 pgs.

*Primary Examiner* — Ryan Jager
(74) *Attorney, Agent, or Firm* — Cooper Legal Group, LLC

(57) ABSTRACT

A delay circuit and a delay structure are provided. The circuit includes: a first delay unit configured to delay a rising edge and/or a falling edge of a pulse signal, where, an input terminal of the first delay unit receives the pulse signal, and an output terminal of the first delay unit outputs a first delay signal, and a second delay unit, configured to delay the first delay signal, where an input terminal of the second delay unit is connected to the output terminal of the first delay unit, and an output terminal of the second delay unit outputs a second delay signal.

19 Claims, 10 Drawing Sheets

(56) References Cited

U.S. PATENT DOCUMENTS

| | | | | |
|---|---|---|---|---|
| 6,452,430 | B1* | 9/2002 | Tung | H03L 7/0995 327/158 |
| 6,483,359 | B2* | 11/2002 | Lee | G11C 7/22 327/158 |
| 6,598,212 | B2* | 7/2003 | Okayasu | H03K 5/133 716/136 |
| 7,319,349 | B2* | 1/2008 | Tomita | G06F 1/12 327/144 |
| 7,518,422 | B2* | 4/2009 | Johnson | H03L 7/0814 327/158 |
| 7,525,364 | B2* | 4/2009 | Ariyoshi | H03L 7/0805 327/155 |
| 7,795,934 | B2* | 9/2010 | Johnson | H03L 7/0818 327/158 |
| 8,278,986 | B2* | 10/2012 | Betti | H03K 5/131 327/170 |
| 8,299,988 | B2 | 10/2012 | Oishi | |
| 10,444,338 | B2* | 10/2019 | Ärlelid et al. | G01S 7/28 |
| 10,644,707 | B2 | 5/2020 | Jung | |
| 2003/0214339 | A1* | 11/2003 | Miyamoto | H03L 7/087 327/276 |
| 2005/0184787 | A1 | 8/2005 | Tomita | |
| 2006/0267658 | A1 | 11/2006 | Tomita | |
| 2009/0167398 | A1 | 7/2009 | Oishi | |
| 2011/0156785 | A1 | 6/2011 | Bettini | |
| 2013/0009796 | A1 | 1/2013 | Sakiyama | |
| 2013/0176062 | A1* | 7/2013 | Wang | H03K 5/133 327/161 |
| 2019/0190505 | A1* | 6/2019 | Yi | H03K 5/135 |
| 2019/0280697 | A1 | 9/2019 | Jung | |

FOREIGN PATENT DOCUMENTS

| | | |
|---|---|---|
| CN | 101814907 A | 8/2010 |
| CN | 110246529 A | 9/2019 |

* cited by examiner

DELAY CIRCUIT AND DELAY STRUCTURE

CROSS-REFERENCE TO RELATED APPLICATIONS

This application is a US continuation application of International Application No. PCT/CN2021/097593, filed on Jun. 1, 2021, which claims priority to Chinese Patent Application No. 202010985337.8, filed to the China National Intellectual Property Administration, PRC (CNIPA) on Sep. 18, 2020 and entitled "DELAY CIRCUIT AND DELAY STRUCTURE". The disclosures of International Application No. PCT/CN2021/097593 and Chinese Patent Application No. 202010985337.8 are hereby incorporated by reference in their entireties.

BACKGROUND

At present, a delay circuit is often used in a semiconductor component, and refers to a circuit that can delay a pulse signal for a certain period of time. FIG. 1 is a schematic diagram of an input signal and an output signal obtained through a delay circuit. After the input signal passes through the delay circuit, a delay signal is output. As shown in FIG. 1, the output signal is a signal after the input signal is delayed for a time T. FIG. 1 shows the case where both a rising edge and a falling edge of the input signal are delayed for the time T. There is also a case where only the rising edge of the input signal is delayed for the time T or only the falling edge of the input signal is delayed for the time T.

SUMMARY

The present disclosure relates to the technical field of integrated circuits, particularly to a delay circuit and a delay structure.

The present disclosure provides a delay circuit and a delay structure, for ensuring that a delay of an output signal obtained through the delay circuit may have minor variation with a variation of at least one of the following: manufacturing process, power supply voltage wave, or working temperature of the delay circuit.

In a first aspect, the present disclosure provides a delay circuit. The delay circuit includes a first delay unit and a second delay unit.

The first delay unit is configured to delay a rising edge and/or a falling edge of a pulse signal. An input terminal of the first delay unit receives the pulse signal, and an output terminal of the first delay unit outputs a first delay signal.

The second delay unit is configured to delay the first delay signal. An input terminal of the second delay unit is connected to the output terminal of the first delay unit, and an output terminal of the second delay unit outputs a second delay signal.

A delay time between a rising edge of the second delay signal and the rising edge of the pulse signal is denoted as a rising edge delay time. A delay time between a falling edge of the second delay signal and the falling edge of the pulse signal is denoted as a falling edge delay time. A variation value, varying with a first parameter, of the rising edge delay time and/or the falling edge delay time is within a first range, and the first parameter includes at least one of the following: manufacturing process, power supply voltage wave, or working temperate of the delay circuit.

In a second aspect, the present disclosure provides a delay structure. The delay structure includes a plurality of delay circuits as mentioned in the above first aspect.

The plurality of delay circuits as mentioned in the above first aspect are connected in series. An input terminal of a first one of the delay circuits receives a pulse signal, an output terminal of an (M−1)th one of the delay circuits is connected to an input terminal of an Mth one of the delay circuits, and an output terminal of the Mth one of the delay circuits outputs a delay signal with a preset delay time. M is an integer greater than or equal to 2.

DETAILED DESCRIPTION

In the existing delay circuit, a delay time T of an output signal obtained through the delay circuit will significantly vary (being longer or shorter) with variations of parameters such as power supply voltage, operating temperature, and manufacturing process, which will affect performance of the delay circuit. How to ensure a minor variation of the delay time T during varying of the above-mentioned parameters is an urgent problem to be solved.

The technical solutions in the embodiments of the present disclosure will be clearly and completely described below in combination with the drawings in the embodiments of the present disclosure. It is apparent that the described embodiments are not all embodiments but merely part of embodiments of the present disclosure. All other embodiments obtained by those of ordinary skill in the art on the basis of the embodiments in the present disclosure without creative work shall fall within the scope of protection of the present disclosure.

The terms "first", "second", etc. in the specification and claims of the present disclosure and in the above drawings are used for distinguishing similar objects and not necessarily for describing a specific sequence or sequential order. It should be understood that such used data may be interchangeable under an appropriate circumstance, so that the embodiments of the present disclosure described herein are, for example, capable of being implemented in a sequence other than those illustrated or described herein.

Furthermore, the terms "comprise" and "having", as well as any variations thereof, are intended to cover a non-exclusive inclusion. For example, a process, a method, a system, a product, or an apparatus that includes a series of steps or elements is not necessarily limited to those expressly listed steps or elements, but may contain other steps or elements not expressly listed or inherent to such process, method, product, or apparatus.

First, a rising edge delay time and a falling edge delay time will be explained to facilitate understanding.

Figure 1:
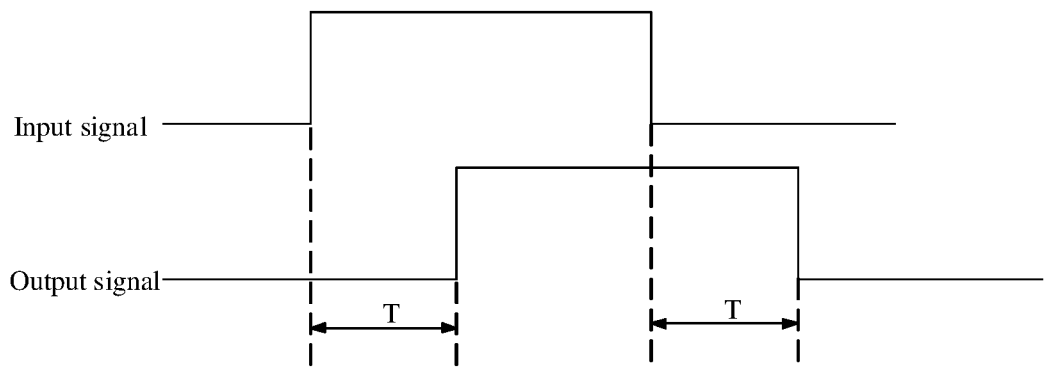
FIG. 1 is a schematic diagram of an input signal and an output signal obtained through a delay circuit.

1. For the rising edge delay time, in FIG. 1 being a schematic diagram of an input signal and an output signal obtained through a delay circuit, as shown in FIG. 1, a delay time T between a rising edge of the output signal and a rising edge of the input signal is the rising edge delay time.

2. For the falling edge delay time, as shown in FIG. 1, a delay time T between a falling edge of the output signal and a falling edge of the input signal is the falling edge delay time.

Figure 2:
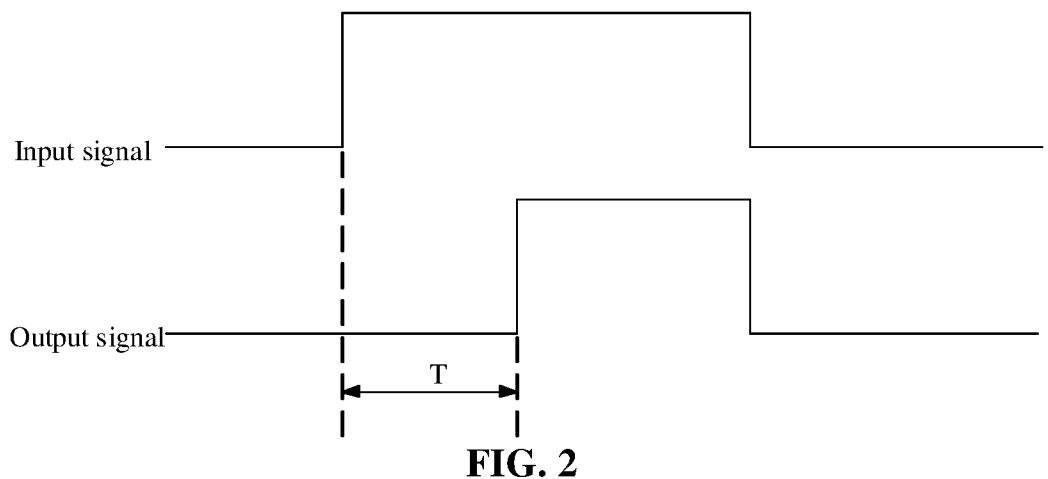
FIG. 2 is a schematic diagram of an input signal and an output signal obtained through a delay circuit.
Figure 3:
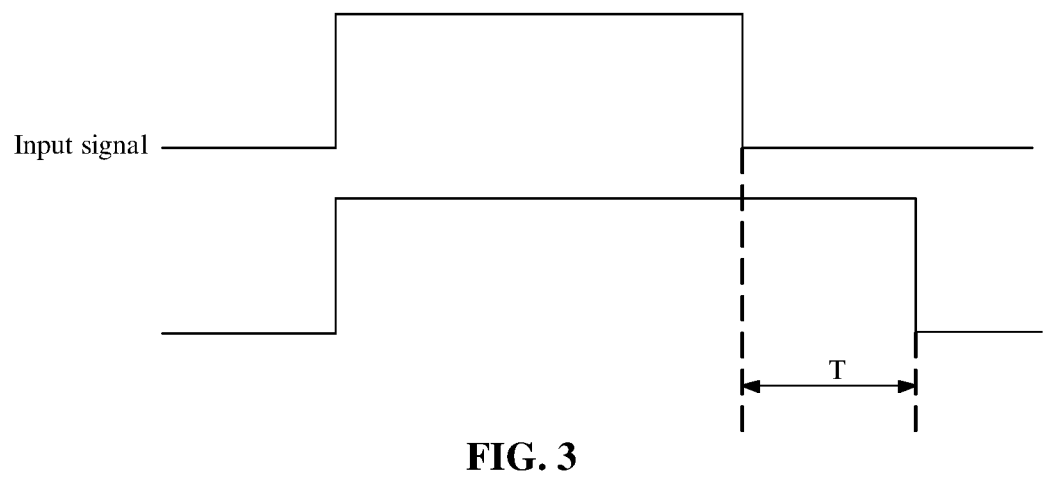
FIG. 3 is a schematic diagram of an input signal and an output signal obtained through a delay circuit.

Through a delay circuit provided in the present disclosure, both the rising edge and the falling edge of the input signal may be delayed for a time T, without variation of a pulse signal width. As shown in FIG. 1, the rising edge of the input signal may be delayed for a time T, or the falling edge of the input signal may also be delayed for a time T. FIG. 2 is a schematic diagram of an input signal and an output signal obtained through a delay circuit. As shown in FIG. 2, a rising edge of the input signal is delayed for a time T to obtain the output signal, and a pulse signal width is shortened for a time T. FIG. 3 is a schematic diagram of an input signal and an output signal obtained through a delay circuit. As shown in FIG. 3, a falling edge of the input signal is delayed for a time T to obtain the output signal, and a pulse signal width is prolonged for a time T. It should be noted that FIG. 1 to FIG. 3 only show one cycle of a pulse signal.

In the existing delay circuit, a delay time T of an output signal obtained through the delay circuit will significantly vary with variations of parameters such as power supply voltage, operating temperature, and manufacturing process, which will affect performance of the delay circuit. In order to solve the problem, the present disclosure provides a delay circuit, including two delay units. The first delay unit is configured to delay a rising edge and/or a falling edge of a pulse signal, and output a first delay signal. The second delay unit is configured to delay the first delay signal, and outputs a second delay signal. A variation value, varying with at least one of the power supply voltage, working temperature, or manufacturing process, of a rising edge delay time and/or a falling edge delay time of the second delay signal is within a first range. The first range is a small range, for example, a range close to 0. For example, a first range is 1%, or 3%, or 5%, so that a delay of an output signal obtained through the delay circuit may have minor variation with a variation of at least one of the power supply voltage, working temperature, or manufacturing process, and performance of the delay circuit is improved. A specific structure of the delay circuit provided in the present disclosure will be described in detail below through specific embodiments.

Figure 4:
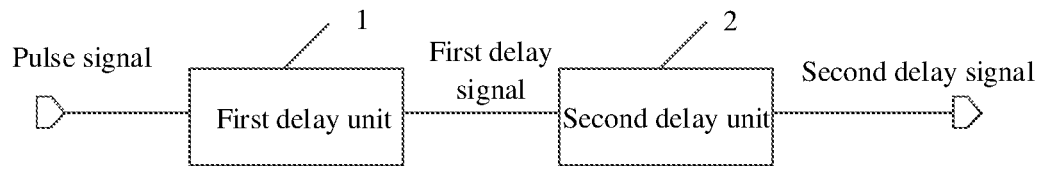
FIG. 4 is a schematic structural diagram of a delay circuit according to the embodiments of the present disclosure.

FIG. 4 is a schematic structural diagram of a delay circuit according to embodiments of the present disclosure. As shown in FIG. 4, the delay circuit of the embodiments may include: a first delay unit 1 and a second delay unit 2. The first delay unit 1 is configured to delay a rising edge and/or a falling edge of a pulse signal, an input terminal of the first delay unit 1 receives the pulse signal, and an output terminal of the first delay unit 1 outputs a first delay signal. The second delay unit 2 is configured to delay the first delay signal, an input terminal of the second delay unit 2 is connected to the output terminal of the first delay unit, and an output terminal of the second delay unit 2 outputs a second delay signal. A delay time between a rising edge of the second delay signal and the rising edge of the pulse signal is denoted as a rising edge delay time. A delay time between a falling edge of the second delay signal and the falling edge of the pulse signal is denoted as a falling edge delay time. A variation value, varying with a first parameter, of the rising edge delay time and/or the falling edge delay time is within a first range, the first range is a small range, for example, a range close to 0. For example, a first range is 1%, or 3%, or 5%, and the first parameter includes at least one of the following: manufacturing process, power supply voltage, or working temperate of the delay circuit. That is, after the pulse signal is delayed through the delay circuit shown in FIG. 1, if a rising edge of the pulse signal is delayed through the delay circuit, then a variation value, varying with the first parameter, of a rising edge delay time of an output signal is within the first range, and keeps constant, substantially. If a falling edge of the pulse signal of the pulse signal is delayed through the delay circuit, then a variation value, varying with the first parameter, of a falling edge delay time of an output signal is within the first range, and keeps constant, substantially. If both a rising edge and a falling edge of the pulse signal are delayed through the delay circuit, then a variation value, varying with the first parameter, of each of a rising edge delay time and a falling edge delay time is within the first range and keeps constant, substantially.

According to the embodiments of the present disclosure, the first delay unit may have different specific circuit structures, and the second delay unit may have different specific circuit structures, and three alternative manners are provided for implementing functions of the first delay unit and the second delay unit.

In the first manner, a variation value, varying with a first parameter, of a charge current and/or a discharge current of the first delay unit is within a first range.

Specifically, since the variation value, varying with the first parameter, of the charge current and/or the discharge current of the first delay unit is within the first range, a variation value, varying with the first parameter, of a rising edge delay time and/or a falling edge delay time of a first delay signal output after being delayed through the first delay unit is within the first range. The first delay signal is delayed through the second delay unit to output a second delay signal, and thus a variation value, varying with the first parameter, of a rising edge delay time and/or a falling edge delay time of the second delay signal may be ensured to be within the first range.

In the second manner, a variation value, varying with a first parameter, of a charge current and/or a discharge current of the second delay unit is within a first range.

Specifically, a pulse signal is delayed through the first delay unit to output a first delay signal; since the variation value, varying with the first parameter, of the charge current and/or the discharge current of the second delay unit is within the first range, and thus a variation value, varying with the first parameter, of a rising edge delay time and/or a falling edge delay time of the second delay signal may be ensured to be within the first range.

In the third manner, a variation value, varying with a first parameter, of a charge current and/or a discharge current of each of the first delay unit and the second delay unit is within the first range.

Specifically, since the variation value, varying with the first parameter, of the charge current and/or the discharge current of each of the first delay unit and the second delay unit is within the first range, a pulse signal is delay through the first delay unit to output a first delay signal, the first delay signal is delayed through the second delay unit to output a second delay signal, and thus a variation value, varying with the first parameter, of a rising edge delay time and/or a falling edge delay time of the second delay signal may be ensured to be within the first range.

The delay circuit according to the embodiment includes a first delay unit and a second delay unit. The first delay unit delays a rising edge and/or a falling edge of a pulse signal, and outputs a first delay signal. The second delay unit delays the first delay signal, and outputs a second delay signal. A variation value, varying with at least one of the power supply voltage, working temperature, or manufacturing process, of a rising edge delay time and/or a falling edge delay time of the second delay signal is within a first range, the first range is a minor range, so that a delay of an output signal obtained through the delay circuit may have a minor variation with a variation of at least one of the power supply voltage, working temperature, or manufacturing process, and performance of the delay circuit is improved.

The structure of the delay circuit of the present disclosure will be described below in conjunction with specific embodiments. The specific structure of the delay circuit of the present disclosure is not limited to any of the following structures.

Alternatively, the delay circuit provided in the present disclosure has the following three circuit structures.

Figure 5:
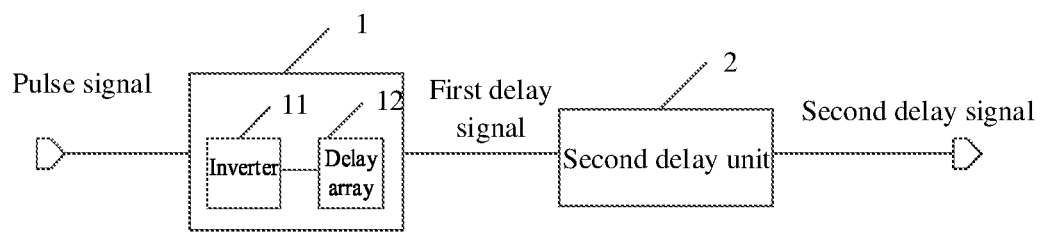
FIG. 5 is a schematic structural diagram of a delay circuit according to the embodiments of the present disclosure.

1. The first delay unit includes an inverter and a delay array. FIG. 5 is a schematic structural diagram of a delay circuit according to the embodiments of the present disclosure. As shown in FIG. 5, the first delay unit includes an inverter 11 and a delay array 12, and an output terminal of the inverter 11 is connected to an input/output terminal of the delay array 12.

Figure 6:
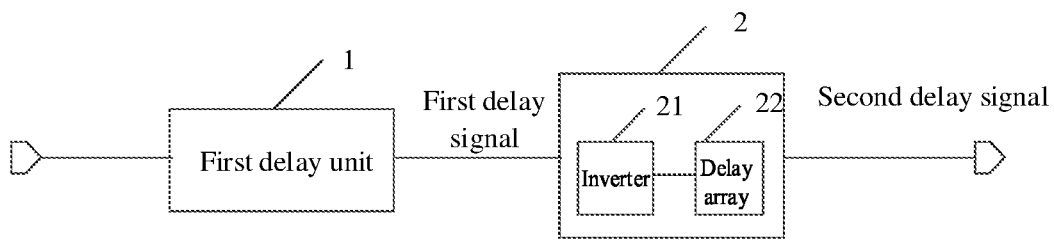
FIG. 6 is a schematic structural diagram of a delay circuit according to the embodiments of the present disclosure.

2. The second delay unit includes an inverter and a delay array. FIG. 6 is a schematic structural diagram of a delay circuit according to the embodiments of the present disclosure. As shown in FIG. 6, the second delay unit includes an inverter 21 and a delay array 22, and an output terminal of the inverter 21 is connected to an input/output terminal of the delay array 22.

Figure 7:
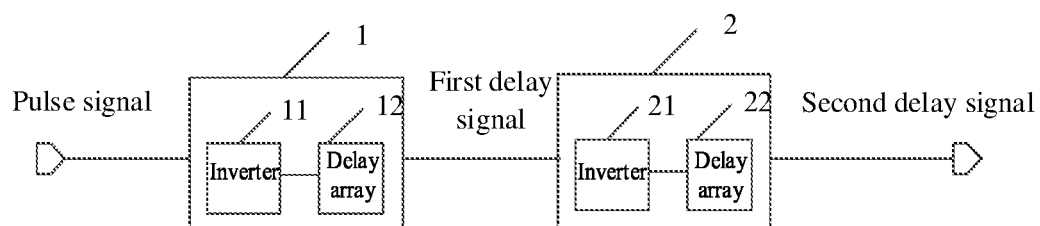
FIG. 7 is a schematic structural diagram of a delay circuit according to the embodiments of the present disclosure.

3. The first delay unit includes an inverter and a delay array, and the second delay unit includes an inverter and a delay array. FIG. 7 is a schematic structural diagram of a delay circuit according to the embodiments of the present disclosure. As shown in FIG. 7, the first delay unit includes an inverter 11 and a delay array 12, the second delay unit includes an inverter 21 and a delay array 22, an output terminal of the inverter 11 is connected to an input/output terminal of the delay array 12, and an output terminal of the inverter 21 is connected to an input/output terminal of the delay array 22.

In the three circuit structures, the output terminal of the inverter is connected to the input/output terminal of the delay array, and the inverter has a power supply terminal and a ground terminal; a charge current flows to the delay array from the power supply terminal through the inverter; and a discharge current flows to the ground terminal from the delay array through the inverter.

Further, the delay array may include N delay sub-arrays in parallel connection, first terminals of the N delay sub-arrays serve as the input/output terminal of the delay array, and second terminals of the N delay sub-arrays are electrically connected to the ground terminal or the power supply terminal, herein N is an integer greater than or equal to 2.

Taking the first circuit structure as an example, FIG. 7 is a schematic structural diagram of a delay circuit according to the embodiments of the present disclosure. As shown in FIG. 7, the first delay unit 1 includes an inverter 11 and a delay array 12, the second delay unit 2 includes an inverter 21 and a delay array 22, an output terminal of the inverter 11 is connected to an input/output terminal of the delay array 12, the inverter 11 has a power supply terminal Vcc and a ground terminal Vss, a charge current flows to the delay array 12 from the power supply terminal Vcc through the inverter 11; and a discharge current flows to the ground terminal Vss from the delay array 12 through the inverter 11.

Figure 8:
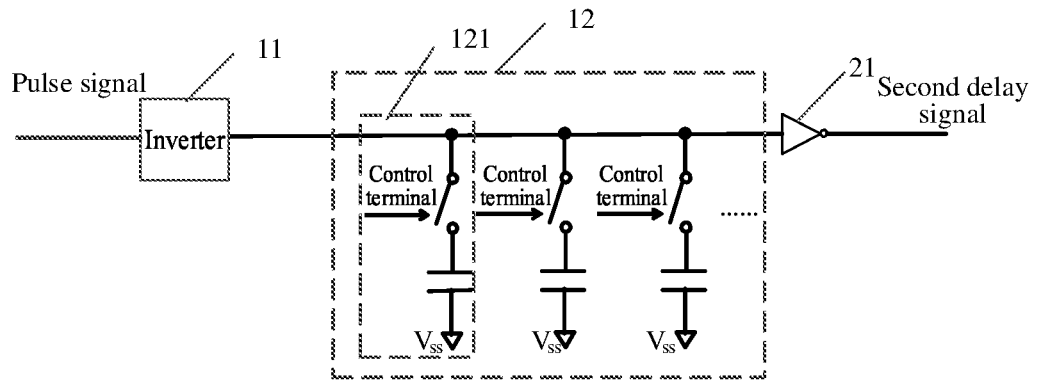
FIG. 8 is a schematic structural diagram of a delay circuit according to the embodiments of the present disclosure.

Further, as an alternative manner, as shown in FIG. 8, the delay array 12 may include N delay sub-arrays 121 in parallel connection, the first terminals of the N delay sub-arrays 121 serve as the input/output terminal of the delay array, and the second terminals of the N delay sub-arrays 121 are electrically connected to a ground terminal Vss, herein N is an integer greater than or equal to 2.

Alternatively, as shown in FIG. 8, each delay sub-array 121 may include a switch and a capacitor, a first terminal of the switch serves as a first terminal or a second terminal of the delay sub-array 121, a second terminal of the switch is connected to a first terminal of the capacitor, and a second terminal of the capacitor serves as a second terminal or a first terminal of the delay sub-array 121. That is, in an alternative manner, each delay sub-array 121 may include a switch and a capacitor, a first terminal of the switch serves as a first terminal of the delay sub-array 121, a second terminal of the switch is connected to a first terminal of the capacitor, and a second terminal of the capacitor serves as a second terminal of the delay sub-array 121. Alternatively a first terminal of the switch serves as a second terminal of the delay sub-array 121, a second terminal of the switch is connected to a first terminal of the capacitor, and a second terminal of the capacitor serves as a first terminal of the delay sub-array 121.

Further, as an implementable manner, an equivalent capacitance value exists between the first terminal and the second terminal of the delay sub-array 121, and the equivalent capacitance values of the N delay sub-arrays 121 are same; the delay array 12 further receives a capacitance value adjusting code, and each bit of the capacitance value adjusting code is configured to control a control terminal of the switch. For example, as shown in FIG. 8, the number of delay sub-arrays 121 is 3, e.g., a capacitance value adjusting code received by the delay array 12 is "101", where "0" indicates that switch is in non-conduction, and "1" indicates that switch is in conduction. Control terminals of the first delay sub-array 121 and the third delay sub-array 121 as shown in FIG. 8 control the switches to be in conduction, and control terminal of the second delay sub-array 121 controls the switch to be in non-conduction. With control of the capacitance value adjusting code, the number of the delay sub-arrays 121 that are on may be adjusted, so that different delay times may be implemented.

As another implementable manner, an equivalent capacitance value exists between the first terminal and the second terminal of the delay sub-array 121, and the equivalent capacitance values of the N delay sub-arrays are set in a form of arithmetic sequence or a geometric sequence; the delay array 12 further receives a capacitance value adjusting code, and each bit of the capacitance adjusting code is configured to control a control terminal of the switch. For example, as shown in FIG. 8, the number of delay sub-arrays 121 is 5, e.g., a capacitance value adjusting code received by the delay array 12 is "10101", where "0" indicates that switch is in non-conduction, and "1" indicates that switch is in conduction. Control terminals the first delay sub-array 121, the third delay sub-array 121, and the fifth delay sub-array 121 as shown in FIG. 8 control the switches to be in conduction, and control terminals of the second delay sub-array 121 and the fourth delay sub-array 121 control the switches to be in non-conduction. With control of the capacitance value adjusting code, the number of the delay sub-arrays 121 that are on may be adjusted, so that different delay times may be implemented. The difference of the implementation manner over the previous implementation lies in that the equivalent capacitance values of the N delay sub-arrays 121 in the previous implementation manner are the same, and the equivalent capacitance values of the N delay sub-arrays 121 in this implementation manner are different and set in a form of arithmetic sequence or a geometric sequence. This implementation manner may be much flexible in adjusting different delay times.

The delay circuit shown in FIG. 8 may implement performing delay on a rising edge of a pulse signal.

Figure 9:
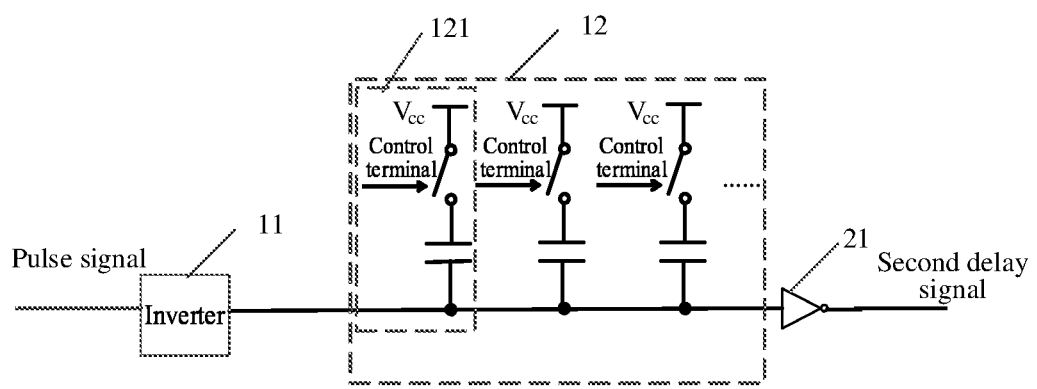
FIG. 9 is a schematic structural diagram of a delay circuit according to the embodiments of the present disclosure.

Taking the first circuit structure as an example, FIG. 9 is a schematic structural diagram of a delay circuit according to the embodiments of the present disclosure. The delay circuit shown in FIG. 9 may implement delay on a falling edge of a pulse signal. As shown in FIG. 9, the difference of the delay circuit shown in FIG. 9 over the delay circuit shown in FIG. 8 lies in: the second terminal of each of the N delay sub-arrays 121 in FIG. 8 is electrically connected to the ground terminal Vss, while a second terminal of each of N delay sub-arrays 121 in FIG. 9 is electrically connected to a power supply terminal Vcc. Other structure and connection manners are the same, which will not be elaborated here.

The specific structure of the inverter shown in FIG. 8 and a specific structure of a delay sub-array 121 shown in FIG. 8 will be described below with reference to FIG. 10 and FIG. 11.

Figure 10:
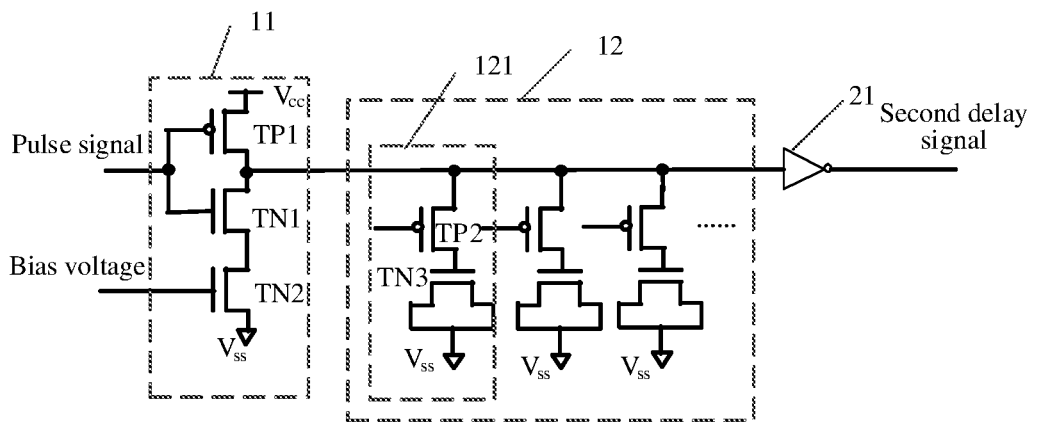
FIG. 10 is a schematic structural diagram of a delay circuit according to the embodiments of the present disclosure.

FIG. 10 is a schematic structural diagram of a delay circuit according to the embodiments of the present disclosure. FIG. 10 shows a specific circuit structure corresponding FIG. 8. As shown in FIG. 10, an inverter 11 includes a first transistor, a second transistor, and a third transistor. The first transistor may be a P-channel Metal Oxide Semiconductor (PMOS) transistor TP1, the second transistor may be an N-channel Metal Oxide Semiconductor (NMOS) transistor TN1, and the third transistor may be a NMPS transistor TN2. The control terminal of TP1 is connected to the control terminal of the second transistor TN1, a first terminal of TP1 is connected to a power supply terminal, a second terminal of TP1 is connected to a first terminal of TN1, a second terminal of TN1 is connected to a first terminal of TN2, a second terminal of TN2 is connected to a ground terminal, and a control terminal of TN2 is connected to a bias voltage. The control terminal of TP1 serves as an input terminal of the inverter 11, and the second terminal of TP1 serves as an output terminal of the inverter 11. As shown in FIG. 10, each delay sub-array 121 includes a switch and a capacitor. The switch may be a PMOS transistor TP2, and a first terminal and a second terminal of an NMOS transistor TN3 are connected to a ground terminal to form the capacitor.

Figure 11:
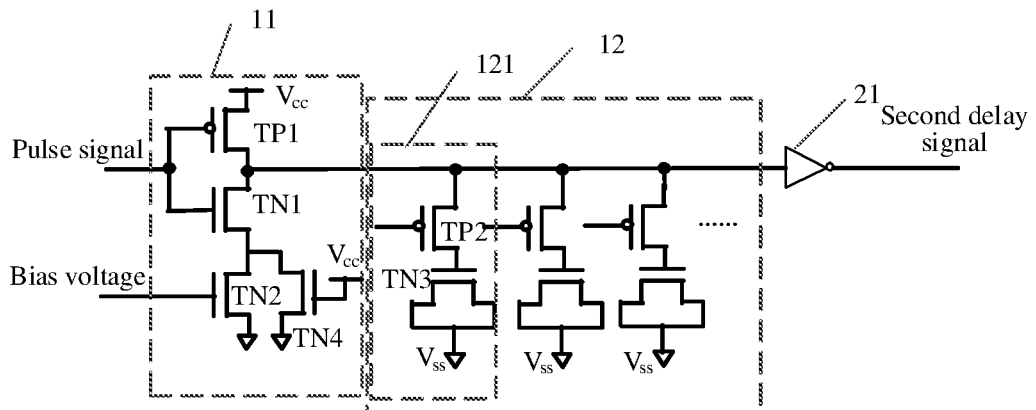
FIG. 11 is a schematic structural diagram of a delay circuit according to the embodiments of the present disclosure.

FIG. 11 is a schematic structural diagram of a delay circuit according to the embodiments of the disclosure. Based on the delay circuit shown in FIG. 10, the inverter 11 further includes a fourth transistor which may be an NMOS transistor TN4. A first terminal of TN4 is connected to the first terminal of TN2, a second terminal of TN4 is connected to a ground terminal, and a control terminal of TN4 is connected to a power supply terminal Vcc. A current flowing through TN2 is a substantially constant current, which does not vary with variations of the manufacturing process, power supply voltage, and working temperature. A current flowing through TN4 is increased with an increase of the power supply terminal Vcc (a power supply voltage) and is decreased with a decrease of the power supply terminal Vcc (the power supply voltage), so that a current flowing through TN1 is increased with an increase of the power supply voltage and decreased along with a decrease of the power supply voltage, so that a discharge current, flowing through TN1, of the delay array 12 vary with the power supply voltage, and further, a delay time caused by the inverter 11 and the delay array 12 substantially keeps constant or within a first range. For example, when the working temperature rises, the current respectively flowing through TN2 and TN4 substantially keeps constant or within the first range, so that the a discharge current, flowing through TN1, of the delay array 12, substantially keeps constant or within the first range, and further the delay time caused by the inverter 11 and the delay array 12 substantially keeps constant or within the first range. For another example, when the power supply voltage rises, the current flowing through TN2 substantially keeps constant or within a first range, the current flowing through TN4 is increased, so that the discharge current, flowing through TN1, of the delay array 12 is increased. With rise of the power supply voltage, more charges are stored in the delay array 12 (or an initial value of a discharge voltage is higher), so that the delay time caused by the inverter 11 and the delay array 12 substantially keeps constant or within the first range.

The specific structure of the inverter shown in FIG. 9 and a specific structure of a delay sub-array 121 shown in FIG. 9 will be described below with reference to FIG. 12 and FIG. 13.

Figure 12:
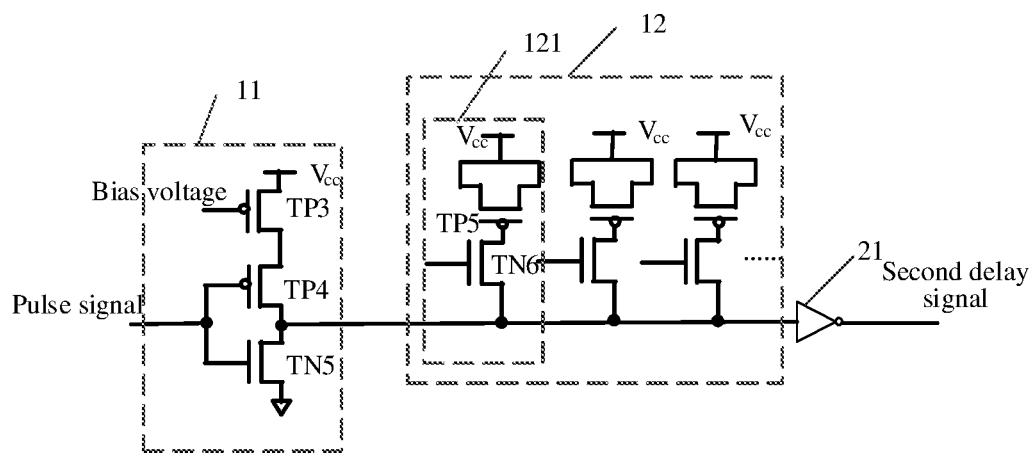
FIG. 12 is a schematic structural diagram of a delay circuit according to the embodiments of the present disclosure.

FIG. 12 is a schematic structural diagram of a delay circuit according to the embodiments of the present disclosure. FIG. 12 shows a specific circuit structure corresponding FIG. 9. As shown in FIG. 12, the inverter includes a first transistor, a second transistor, and a third transistor. The first transistor may be a PMOS transistor TP3, the second transistor may be a PMOS transistor TP4, and the third transistor may be an NMOS transistor TN5. A first terminal of TP3 is connected to a power supply terminal Vcc, a second terminal of TP3 is connected to a first terminal of TP4, a control terminal of TP4 is connected to a control terminal of TN5, a second terminal of TP4 is connected to a first terminal of TP5, a second terminal of TN5 is connected to a ground terminal Vss, and a control terminal of TP3 is connected to a bias voltage. A control terminal of TP4 serves as an input terminal of the inverter, and the second terminal of TP4 serves as an output terminal of the inverter. As shown in FIG. 12, each delay sub-array 121 includes a switch and a capacitor. The switch may be an NMOS transistor TN6, and a first terminal and a second terminal of a PMOS transistor TP5 are connected to a power supply terminal to form the capacitor.

Figure 13:
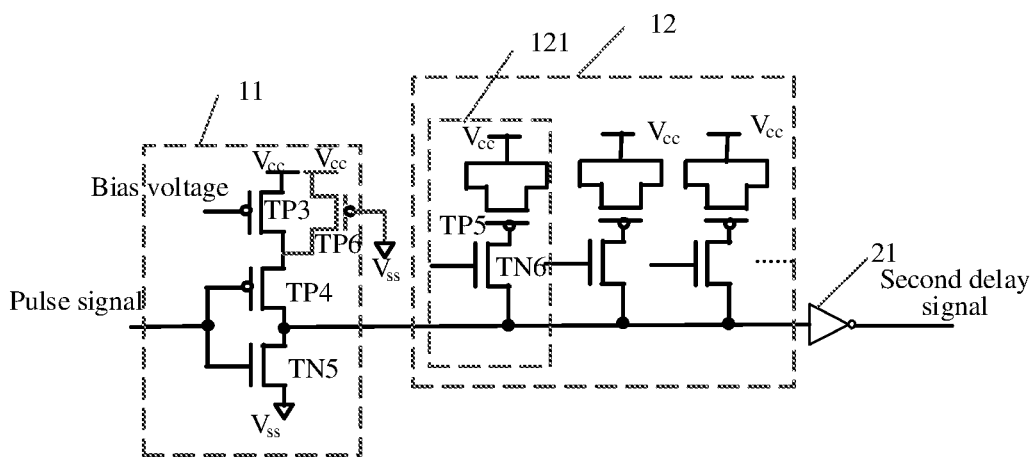
FIG. 13 is a schematic structural diagram of a delay circuit according to the embodiments of the present disclosure.

FIG. 13 is a schematic structural diagram of a delay circuit according to the embodiments of the present disclosure. Based on the delay circuit shown in FIG. 12, the inverter 11 further includes a fourth transistor which may be a PMOS transistor TP6. A first terminal of TN6 is connected to a power supply terminal Vcc, a second terminal of TP6 is connected to a second terminal of TP3, and a control terminal of TP6 is connected to a ground terminal Vss.

In FIG. 13, a current flowing through TP3 is a substantially constant current, which does not vary with variations of the manufacturing process, power supply voltage, and working temperature. A current flowing through TP6 is increased with an increase of the power supply terminal Vcc (a power supply voltage) and is decreased with a decrease of the power supply terminal Vcc (the power supply voltage), so that a current flowing through TP4 is increased with an increase of the power supply voltage and decreased with a decrease of the power supply voltage, a charge current, flowing through TP4, of the delay array 12 varies with the power supply voltage, and further, a delay time caused by the inverter 11 and the delay array 12 substantially keeps constant or within a first range. For example, when the working temperature rises, the current respectively flowing through TP3 and TP6 substantially keeps constant or within a first range, so that the charge current, flowing through TP4, of the delay array 12, substantially keeps constant or within the first range, and further the delay time caused by the inverter 11 and the delay array 12 substantially keeps constant or within the first range. For another example, when the power supply voltage rises, the current flowing through TP3 substantially keeps constant or within a first range, the current flowing through TP6 is increased, so that the charge current, flowing through TP4, to the delay array 12 is increased. With rise of the power supply voltage, more charges need to be stored in the delay array 12 (or a final value of a charge voltage is substantially equal to Vcc, which is greater), so that the delay time caused by the inverter 11 and the delay array 12 substantially keeps constant or within the first range.

Figure 14:
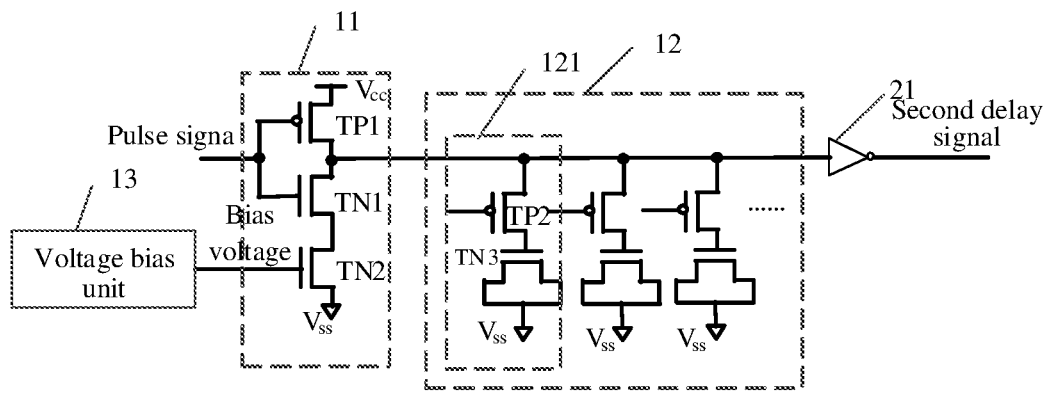
FIG. 14 is a schematic structural diagram of a delay circuit according to the embodiments of the present disclosure.

Further, the bias voltage shown in FIG. 10 to FIG. 13 may be output from a voltage bias control unit. Based on the delay circuit shown in any of FIG. 10 to FIG. 13, the delay circuit may further include a voltage bias control unit. Taking based on the delay circuit shown in FIG. 10 as an example, FIG. 14 is a schematic structural diagram of a delay circuit according to the embodiments of the present disclosure, and based on the delay circuit shown in FIG. 10, the delay circuit may further include a voltage bias control unit 13. The voltage bias control unit 13 outputs a bias voltage, and controls, through the bias voltage, the variation value, varying with a first parameter, of a charge current and/or a discharge current flowing through the inverter 11 to be within a first range.

Figure 15:
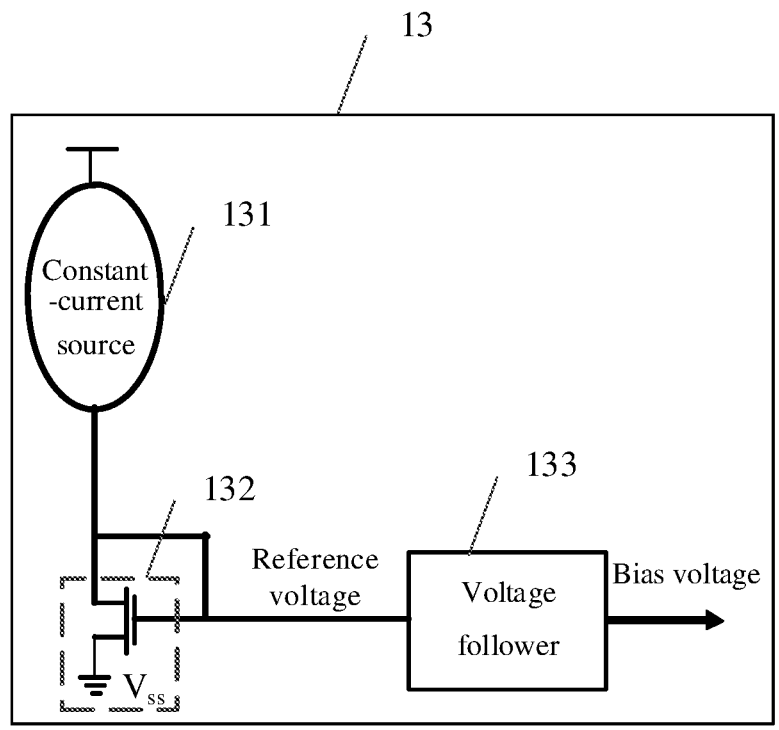
FIG. 15 is a schematic structural diagram of a voltage bias control unit in a delay circuit according to the embodiments of the present disclosure.

An alternative specific structure of a voltage bias control unit will be described below with reference to FIG. 15. FIG. 15 is a schematic structural diagram of a voltage bias control unit in a delay circuit according to the embodiments of the present disclosure. As shown in FIG. 15, a voltage bias control unit 13 includes a constant-current source 131, a fifth transistor 132, and a voltage follower 133.

The constant-current source 131 provides a power supply current, and a variation value, varying with the first parameter, of the power supply current is within the first range.

The constant-current source 131 is connected to a first terminal and a control terminal of the fifth transistor 132, a second terminal of the fifth transistor 132 is connected to a power supply terminal or a ground terminal, and a control terminal of the fifth transistor 132 provides a reference voltage. Alternatively, the fifth transistor may be an NMOS transistor.

The control terminal of the fifth transistor 132 is further connected to an input terminal of the voltage follower 133, and an output terminal of the voltage follower 133 serves as an output terminal of the voltage bias control unit 13.

Figure 16:
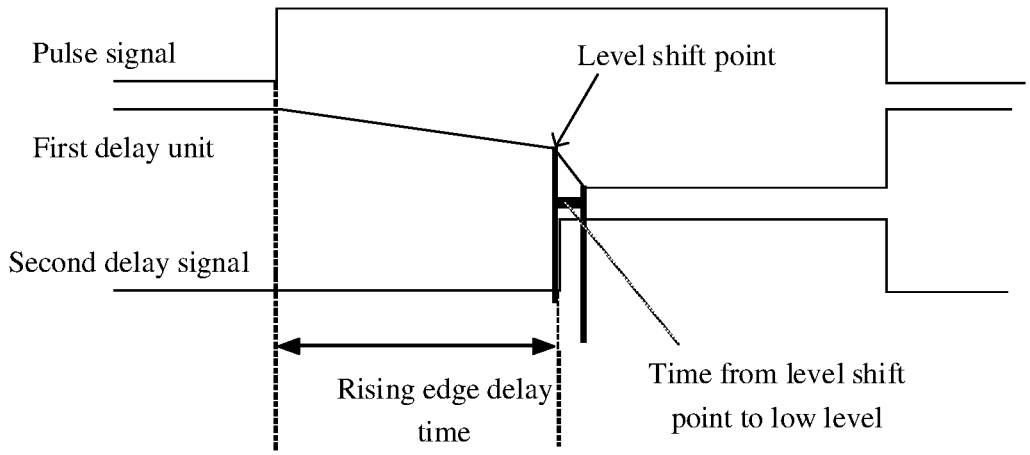
FIG. 16 is a schematic diagram of an input pulse signal and a second delay signal output through a delay circuit.
Figure 17:
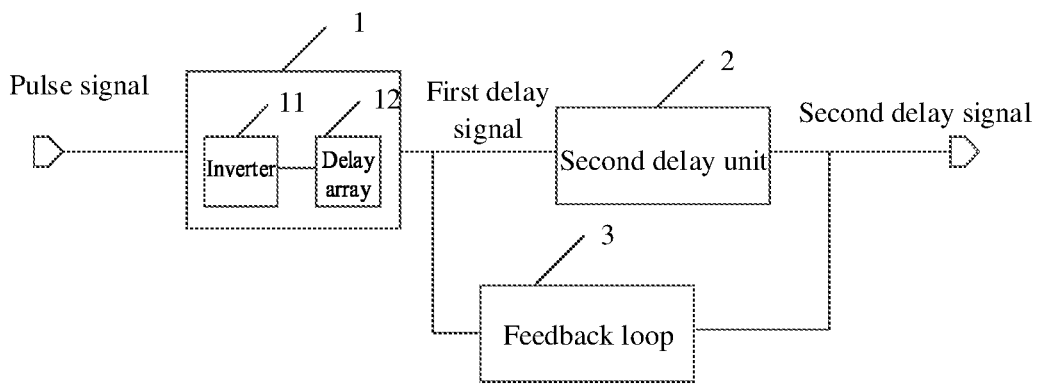
FIG. 17 is a schematic structural diagram of a delay circuit according to the embodiments of the present disclosure.

FIG. 16 is a schematic diagram of an input pulse signal and a second delay signal output through a delay circuit. As shown in FIG. 16, after the input pulse signal is delayed through the delay circuit, a delay time between a rising edge of a first delay signal and a rising edge of the input pulse signal is a rising edge delay time. After delaying a rising edge delay time, the first delay signal needs to be shifted into a low level from a level shift point, quickly, and a time for the first delay signal from the level shift point to the low level needs to be reduced. The above level shift point has two modes, one refers to a critical state where a PMOS of the inverter is just switched on or an NMOS of the inverter is just switched off (for an input signal of the inverter shifting from a high level to a low level), and the other refers to a critical state where an NMOS of the inverter is just switched on or a PMOS of the inverter is just switched off (for an input signal of the inverter shifting from a low level to a high level). According to the embodiments of the present disclosure, based on the three circuit structures described above, the circuit may further include a feedback loop. Taking based on the delay circuit shown in FIG. 5, FIG. 17 is a schematic structural diagram of a delay circuit according to the embodiments of the present disclosure. Based on the delay circuit shown in FIG. 5, the delay circuit according to the embodiments may further include a feedback loop 3. A first terminal of the feedback loop 3 is connected to the output terminal of the second delay unit, and a second terminal of the feedback loop is connected to the input terminal of the second delay unit to reduce a time for the first delay signal from a level shift point to a low level or a time from a level shift point to a high level.

Figure 18:
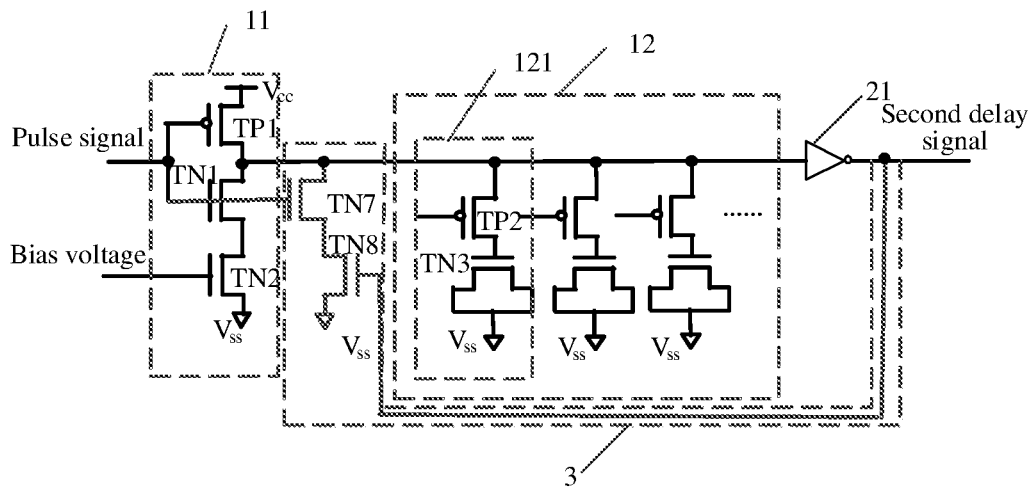
FIG. 18 is a schematic structural diagram of a delay circuit according to the embodiments of the present disclosure.

An alternative specific structure of the feedback loop will be described below in combination with FIG. 18 and FIG. 19. FIG. 18 is a schematic structural diagram of a delay circuit according to the embodiments of the present disclosure, and FIG. 18 is a schematic structural diagram of a delay circuit with a feedback loop added on the basis of the delay circuit shown in FIG. 10. As shown in FIG. 18, the feedback loop 3 includes a seventh transistor and an eighth transistor; the seventh transistor may be an NMOS transistor TN7, and the eighth transistor may be an NMOS transistor TN8. A control terminal of TN8 serves as a first terminal of the feedback loop, a first terminal of TN8 is connected to a second terminal of TN7, a second terminal of TN8 is connected to a ground terminal Vss, a first terminal of TN7 serves as a second terminal of the feedback loop, and a control terminal of TN7 is connected to an input terminal of the first delay unit.

Figure 19:
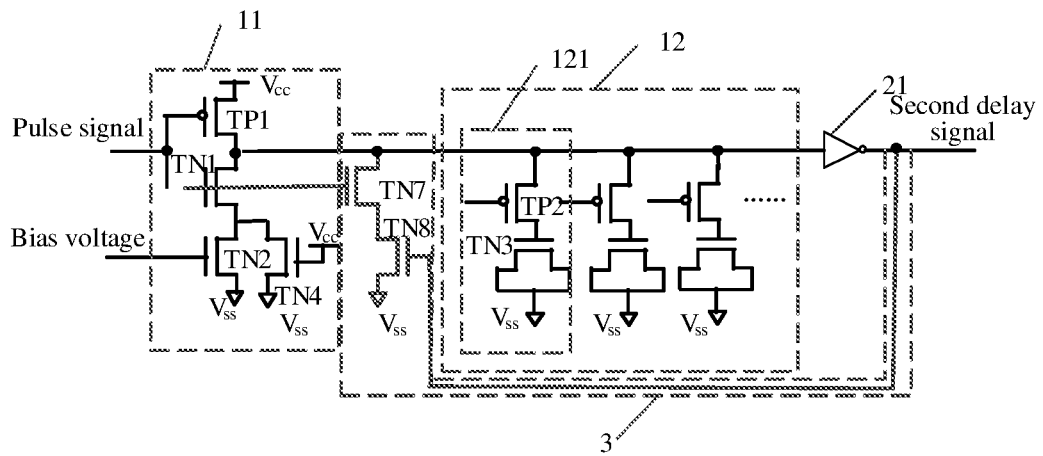
FIG. 19 is a schematic structural diagram of a delay circuit according to the embodiments of the present disclosure.

FIG. 19 is a schematic structural diagram of a delay circuit according to embodiments of the present disclosure, and FIG. 19 is a schematic structural diagram of a delay circuit with a feedback loop added on the basis of the delay circuit shown in FIG. 11. As shown in FIG. 19, the feedback loop 3 includes a seventh transistor and an eighth transistor; the seventh transistor may be an NMOS transistor TN7, and the eighth transistor may be an NMOS transistor TN8. A control terminal of TN8 serves as a first terminal of the feedback loop, a first terminal of TN8 is connected to a second terminal of TN7, a second terminal of TN8 is connected to a ground terminal Vss, a first terminal of TN7 serves as a second terminal of the feedback loop, and a control terminal of TN7 is connected to an input terminal of the first delay unit.

Figure 20:
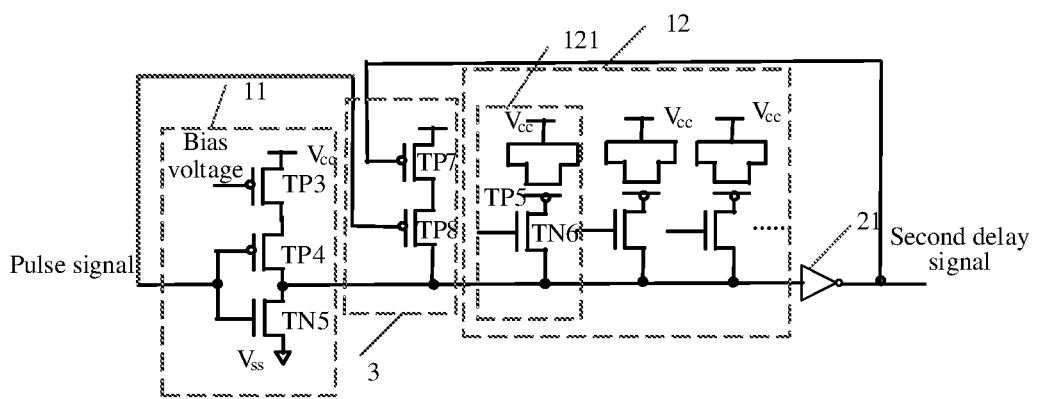
FIG. 20 is a schematic structural diagram of a delay circuit according to the embodiments of the present disclosure.

Other alternative specific structures of the feedback loop will be described below in combination with FIG. 20 and FIG. 21. FIG. 20 is a schematic structural diagram of a delay circuit according to the embodiments of the present disclosure, and FIG. 20 is a schematic structural diagram showing a delay circuit with a feedback loop added on the basis of the delay circuit shown in FIG. 12. As shown in FIG. 20, the feedback loop includes a seventh transistor and an eighth transistor; the seventh transistor may be a PMOS transistor TP7, and the eighth transistor may be a PMOS transistor TP8. A control terminal of TP7 serves as a first terminal of the feedback loop, a second terminal of TP7 is connected to a first terminal of TP8, a first terminal of TP7 is connected to a power supply terminal, a second terminal of TP8 serves as a second terminal of the feedback loop, and a control terminal of TP8 is connected to an input terminal of the first delay unit.

Figure 21:
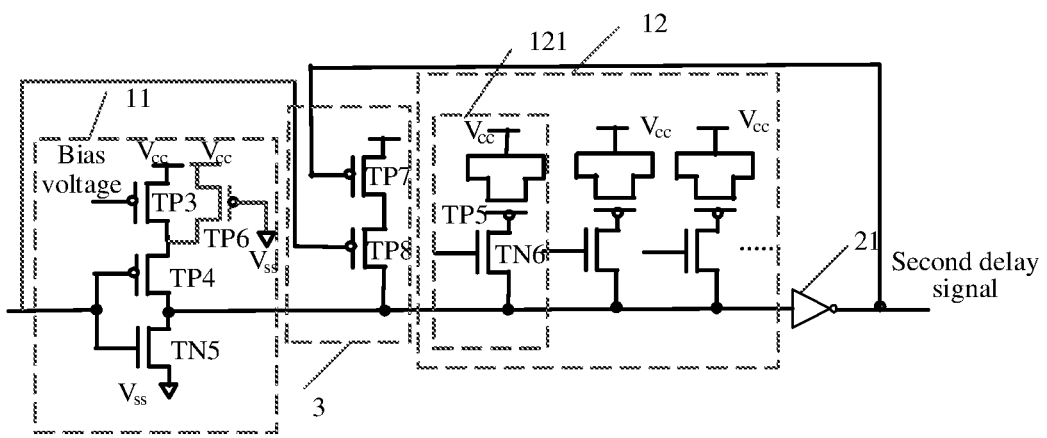
FIG. 21 is a schematic structural diagram of a delay circuit according to the embodiments of the present disclosure.

FIG. 21 is a schematic structural diagram of a delay circuit according to the embodiments of the present disclosure, and FIG. 21 is a schematic structural diagram showing a delay circuit with a feedback loop added on the basis of the delay circuit shown in FIG. 13. As shown in FIG. 21, the feedback loop includes a seventh transistor and an eighth transistor; the seventh transistor may be a PMOS transistor TP7, and the eighth transistor may be a PMOS transistor TP8. A control terminal of TP7 serves as a first terminal of the feedback loop, a second terminal of TP7 is connected to a first terminal of TP8, a first terminal of TP7 is connected to a power supply terminal, a second terminal of TP8 serves as a second terminal of the feedback loop, and a control terminal of TP8 is connected to an input terminal of the first delay unit.

Figure 22:
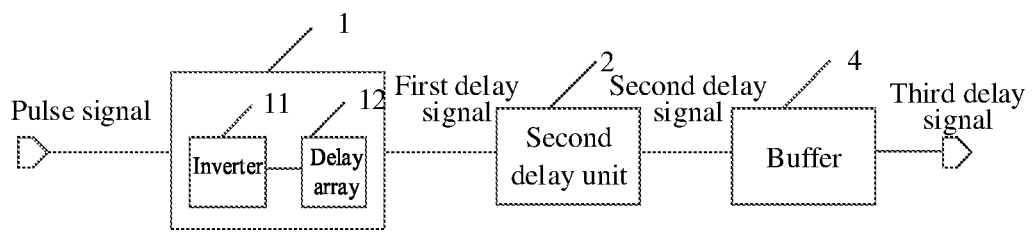
FIG. 22 is a schematic structural diagram of a delay circuit according to the embodiments of the present disclosure.

In order to shape the second delay signal, according to the embodiments of the present disclosure, based on the three circuit structures described above, the circuit may further include a buffer. Taking based on the delay circuit shown in FIG. 5 as an example, FIG. 22 is a schematic structural diagram of a delay circuit according to the embodiments of the present disclosure. Based on the delay circuit shown in FIG. 5, the delay circuit according to the embodiments may further include a buffer 4. An input terminal of the buffer 4 is connected to the output terminal of the second delay unit, an output terminal of the buffer 4 outputs a third delay signal, and the buffer 4 is configured to shape the second delay signal to obtain the third delay signal.

Alternatively, the buffer 4 may be composed of even number of inverters.

Figure 23:
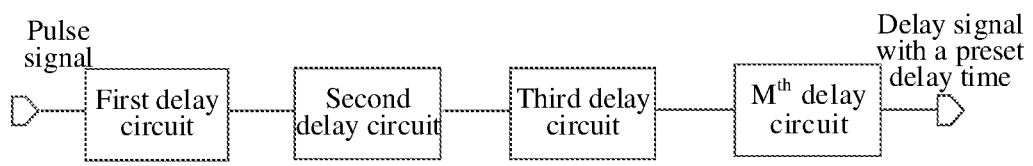
FIG. 23 is a schematic structural diagram of a delay structure according to the embodiments of the present disclosure.

The embodiments of the present disclosure further provide a delay structure, including a plurality of delay circuits, shown in any of FIGS. 4-14, and FIGS. 17-22, connected in series. FIG. 23 is a schematic structural diagram of a delay structure according to the embodiments of the present disclosure. As shown in FIG. 23, an input terminal of a first one of the delay circuits receives a pulse signal, an output terminal of an $(M-1)^{th}$ one of the delay circuits is connected to an input terminal of an $M^{th}$ one of the delay circuit, and an output terminal of the $M^{th}$ one of the delay circuits outputs a delay signal with a preset delay time, herein M is an integer greater than or equal to 2.

In the embodiments, a delay time between a rising edge of the preset delay signal and the rising edge of the pulse signal is denoted as a first preset delay time; a delay time between a falling edge of the preset delay signal and the falling edge of the pulse signal is denoted as a second preset delay time; a variation value, varying with a first parameter of the delay structure, of the first preset delay time and/or the second preset delay time is within a first range.

Figure 24:
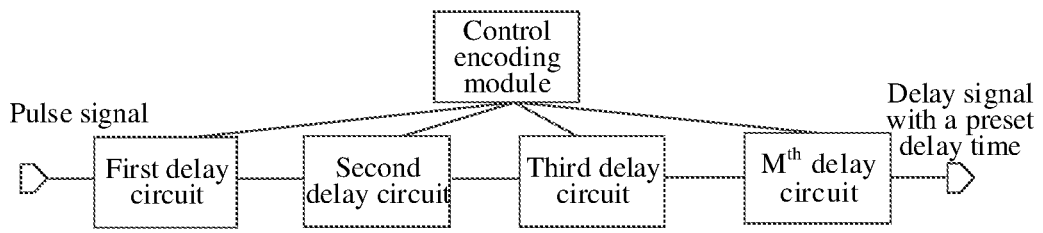
FIG. 24 is a schematic structural diagram of a delay structure according to the embodiments of the present disclosure.

FIG. 24 is a schematic structural diagram of a delay structure according to the embodiments of the present disclosure. As shown in FIG. 24, based on the delay structure shown in FIG. 23, the delay structure further may include a control encoding module, which is connected to each delay circuit, to control a magnitude of first preset delay time and/or the second preset delay time. In some embodiments, the control encoding module may be a hardware component, for example, a control encoding component.

The following takes a delay structure with two specific delay circuits connected in series as an example to illustrate the delay structure.

Figure 25:
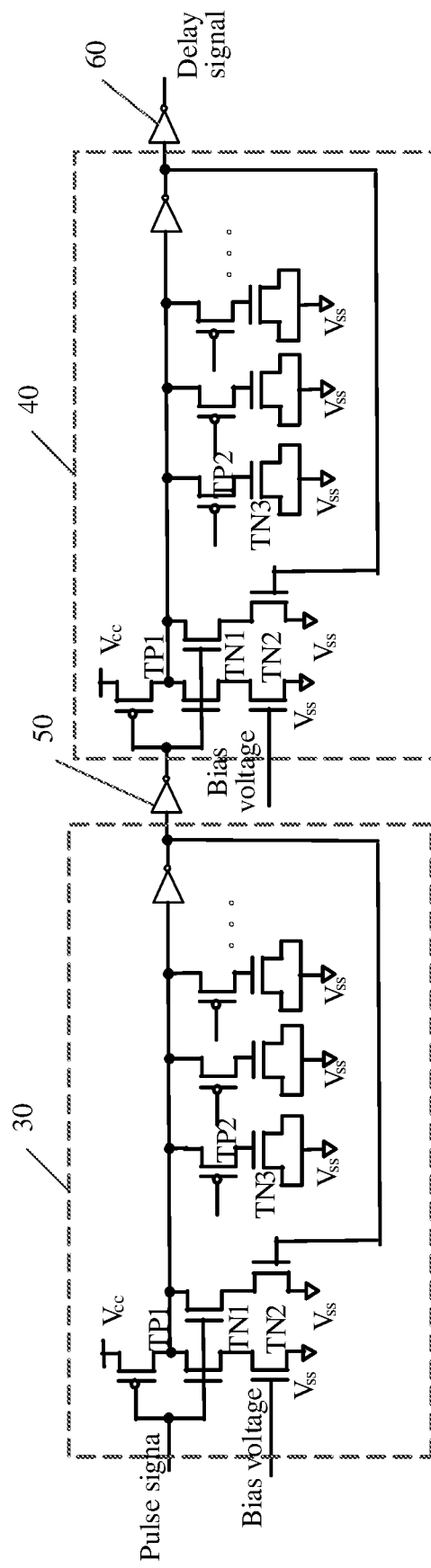
FIG. 25 is a schematic structural diagram of a delay structure according to the embodiments of the present disclosure.

FIG. 25 is a schematic structural diagram of a delay structure according to the embodiments of the present disclosure. As shown in FIG. 25, the delay structure according to the embodiments includes a first delay circuit 30 and a second delay circuit 40 connected in series. An inverter 50 is connected in series between the first delay circuit 30 and the second delay circuit 40. An inverter 60 is connected in series after the second delay circuit 40. A pulse signal passes through the delay structure to output a delay signal. The first delay circuit 30 and the second delay circuit 40 are of the same structure, which are both rising edge delay circuits. Through the delay structure, a rising edge of the pulse signal may be delayed.

It should be noted that both the first delay circuit 30 and the second delay circuit 40 may also be falling edge delay circuits, and may be of the circuit structure shown in FIG. 11.

Figure 26:
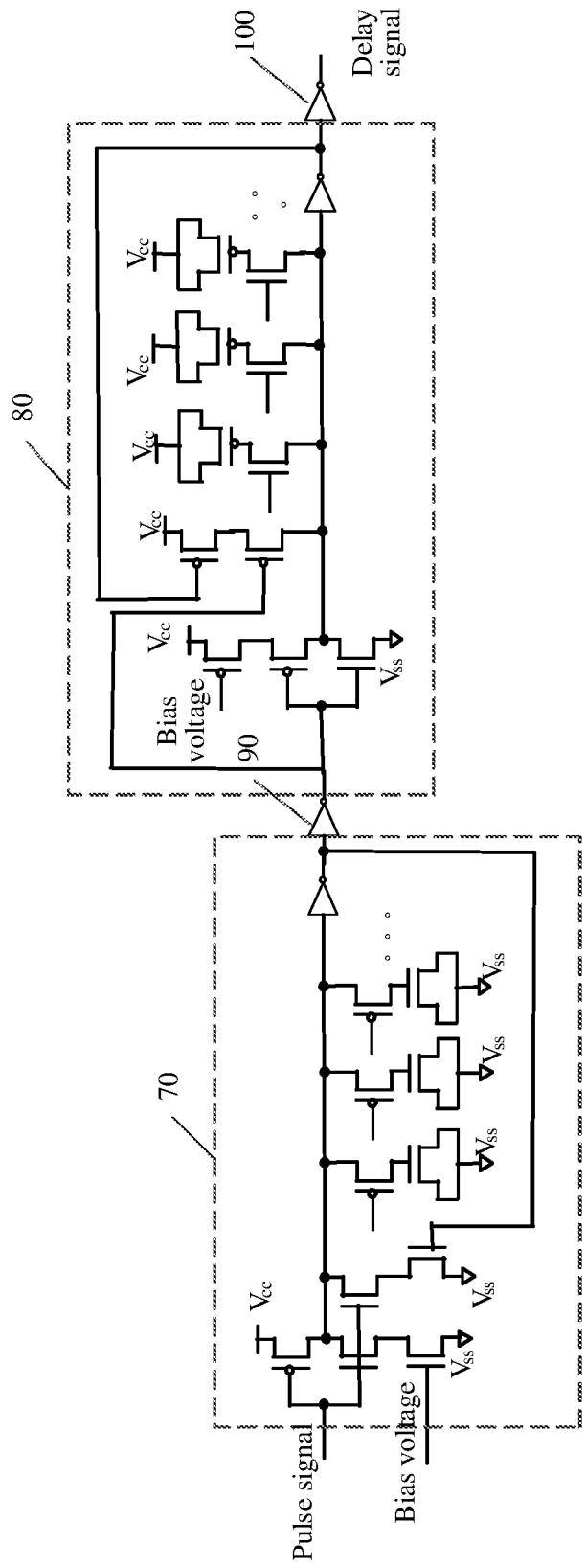
FIG. 26 is a schematic structural diagram of a delay structure according to the embodiments of the present disclosure.

FIG. 26 is a schematic structural diagram of a delay structure according to the embodiments of the present disclosure. As shown in FIG. 26, the delay structure according to the embodiments includes a first delay circuit 70 and a second delay circuit 80 connected in series. An inverter 90 is connected in series between the first delay circuit 70 and the second delay circuit 80. An inverter 100 is connected in series after the second delay circuit 80. A pulse signal passes through the delay structure to output a delay signal. The first delay circuit 70 and the second delay circuit 80 are of different structures, the first delay circuit 70 is a rising edge delay circuit while the second delay circuit 80 is a falling edge delay circuit. Through the delay structure, both a rising edge and a falling edge of the pulse signal may be delayed.

It should be noted that the first delay circuit 70 may also be of the circuit structure shown in FIG. 11. The second delay circuit 80 may also be of the circuit structure shown in FIG. 13.

FIG. 25 and FIG. 26 merely show examples of the delay structure, which do not limit the delay structure of the present disclosure. The number and type (specifically refer to a rising edge delay circuit and a falling edge delay circuit) of the delay circuits connected in series may be selected according to actual delay time as needed.

In some embodiments, the "unit" mentioned in the present disclosure may be specific circuit.

In some embodiments, the present disclosure provides a delay circuit and a delay structure, for ensuring that a delay of an output signal obtained through the delay circuit may have minor variation with a variation of at least one of the following: manufacturing process, power supply voltage wave, or working temperature of the delay circuit.

In some embodiments, the present disclosure provides a delay circuit. The delay circuit includes a first delay unit and a second delay unit.

The first delay unit is configured to delay a rising edge and/or a falling edge of a pulse signal. An input terminal of the first delay unit receives the pulse signal, and an output terminal of the first delay unit outputs a first delay signal.

The second delay unit is configured to delay the first delay signal. An input terminal of the second delay unit is connected to the output terminal of the first delay unit, and an output terminal of the second delay unit outputs a second delay signal.

A delay time between a rising edge of the second delay signal and the rising edge of the pulse signal is denoted as a rising edge delay time. A delay time between a falling edge of the second delay signal and the falling edge of the pulse signal is denoted as a falling edge delay time. A variation value, varying with a first parameter, of the rising edge delay time and/or the falling edge delay time is within a first range, and the first parameter includes at least one of the following: manufacturing process, power supply voltage wave, or working temperate of the delay circuit.

Alternatively, a variation value, varying with the first parameter, of a charge current and/or a discharge current of the first delay unit is within the first range.

Alternatively, a variation value, varying with the first parameter, of a charge current and/or a discharge current of the second delay unit is within the first range.

Alternatively, a variation value, varying with the first parameter, of a charge current and/or a discharge current of each of the first delay unit and the second delay unit is within the first range.

Alternatively, the first delay unit includes an inverter and a delay array.

Alternatively, the second delay unit includes an inverter and a delay array.

Alternatively, the first delay unit includes an inverter and a delay array, and the second delay unit includes an inverter and a delay array.

An output terminal of the inverter is connected to an input/output terminal of the delay array, and the inverter has a power supply terminal and a ground terminal. The charge current flows to the delay array from the power supply terminal through the inverter. The discharge current flows to the ground terminal from the delay array through the inverter.

Alternatively, the delay array includes N delay sub-arrays in parallel connection, first terminals of the N delay sub-arrays serves as the input/output terminal of the delay array, second terminals of the N delay sub-arrays are electrically connected to the ground terminal or the power supply terminal, and N is an integer greater than or equal to 2.

Alternatively, each delay sub-array includes a switch and a capacitor, a first terminal of the switch serves as a first terminal or a second terminal of the delay sub-array, a second terminal of the switch is connected to a first terminal of the capacitor, and a second terminal of the capacitor serves as the second terminal or the first terminal of the delay sub-array.

Alternatively, an equivalent capacitance value exists between the first terminal and the second terminal of the delay sub-array, and equivalent capacitance values of the N delay sub-arrays are same; the delay array further receives a capacitance value adjusting code, and each bit of the capacitance value adjusting code is configured to control a control terminal of the switch.

Alternatively, an equivalent capacitance value exists between the first terminal and the second terminal of the delay sub-array, and equivalent capacitance values of the N delay sub-arrays are set in a form of arithmetic sequence or a geometric sequence; the delay array further receives a capacitance value adjusting code, and each bit of the capacitance value adjusting code is configured to control a control terminal of the switch.

Alternatively, the inverter includes a first transistor, a second transistor, and a third transistor; a control terminal of the first transistor is connected to a control terminal of the second transistor, a first terminal of the first transistor is connected to the power supply terminal, a second terminal of the first transistor is connected to a first terminal of the second transistor, a second terminal of the second transistor is connected to a first terminal of the third transistor, a second terminal of the third transistor is connected to the ground terminal, and a control terminal of the third transistor is connected to a bias voltage; a control terminal of the first transistor serves as an input terminal of the inverter, and the second terminal of the first transistor serves as the output terminal of the inverter.

Alternatively, the inverter further includes a fourth transistor; a first terminal of the fourth transistor is connected to the first terminal of the third transistor, a second terminal of the fourth transistor is connected to the ground terminal, and a control terminal of the fourth transistor is connected to the power supply terminal.

Alternatively, the inverter includes a first transistor, a second transistor, and a third transistor; a first terminal of the first transistor is connected to the power supply terminal, a second terminal of the first transistor is connected to a first terminal of the second transistor, a control terminal of the second transistor is connected to a control terminal of the third transistor, a second terminal of the second transistor is connected to a first terminal of the third transistor, a second terminal of the third transistor is connected to the ground terminal, and a control terminal of the first transistor is connected to a bias voltage; a control terminal of the second transistor serves as an input terminal of the inverter, and the second terminal of the first transistor serves as the output terminal of the inverter.

Alternatively, the inverter may further include a fourth transistor; a first terminal of the fourth transistor is connected to the power supply terminal, a second terminal of the fourth transistor is connected to the second terminal of the first transistor, and a control terminal of the fourth transistor is connected to the ground terminal.

Alternatively, the delay circuit further includes a voltage bias control unit.

The voltage bias control unit outputs the bias voltage, and controls, through the bias voltage, the variation value, varying with the first parameter, of the charge current and/or the discharge current flowing through the inverter to be within the first range.

Alternatively, the voltage bias control unit includes a constant-current source, a fifth transistor, and a voltage follower.

The constant-current source provides a power supply current, and a variation value, varying with the first parameter, of the power supply current is within the first range.

The constant-current source is connected to a first terminal and a control terminal of the fifth transistor, a second terminal of the fifth transistor is connected to the power supply terminal or the ground terminal, and a control terminal of the fifth transistor provides a reference voltage.

The control terminal of the fifth transistor is further connected to an input terminal of the voltage follower, and an output terminal of the voltage follower serves as an output terminal of the voltage bias control unit.

Alternatively, the delay circuit further includes a feedback loop.

A first terminal of the feedback loop is connected to a output terminal of the second delay unit, and a second terminal of the feedback loop is connected to the input terminal of the second delay unit, and the feedback loop is configured to reduce a time for the first delay signal from a level shift point to a low level or a time for the first delay signal from a level shift point to a high level.

Alternatively, the feedback loop includes a seventh transistor and an eighth transistor; a control terminal of the eighth transistor serves as the first terminal of the feedback loop, a first terminal of the eighth transistor is connected to a second terminal of the seventh transistor, a second terminal of the eighth transistor is connected to the ground terminal, a first terminal of the seventh transistor serves as the second terminal of the feedback loop, and a control terminal of the seventh transistor is connected to the input terminal of the first delay unit.

Alternatively, the feedback loop includes a seventh transistor and an eighth transistor; a control terminal of the seventh transistor serves as the first terminal of the feedback loop, a second terminal of the seventh transistor is connected to a first terminal of the eighth transistor, a first terminal of the seventh transistor is connected to the power supply terminal, a second terminal of the eighth transistor serves as the second terminal of the feedback loop, and a control terminal of the eighth transistor is connected to the input terminal of the first delay unit.

Alternatively, the delay circuit further includes a buffer.

An input terminal of the buffer is connected to an output terminal of the second delay unit, an output terminal of the buffer outputs a third delay signal, and the buffer is configured to shape the second delay signal to obtain the third delay signal.

In some embodiments, the present disclosure provides a delay structure. The delay structure includes a plurality of delay circuits as mentioned above.

The plurality of delay circuits as mentioned above are connected in series. An input terminal of a first one of the delay circuits receives a pulse signal, an output terminal of an $(M-1)^{th}$ one of the delay circuits is connected to an input terminal of an $M^{th}$ one of the delay circuits, and an output terminal of the $M^{th}$ one of the delay circuits outputs a delay signal with a preset delay time. M is an integer greater than or equal to 2.

Alternatively, a delay time between a rising edge of the preset delay signal and the rising edge of the pulse signal is denoted as a first preset delay time; a delay time between a falling edge of the preset delay signal and the falling edge of the pulse signal is denoted as a second preset delay time; a variation value, varying with the first parameter of the delay structure, of the first preset delay time and/or the second preset delay time is within the first range.

Alternatively, the delay structure further includes a control encoding component.

The control encoding component is connected to the delay circuit and configured to control a magnitude of the first preset delay time and/or the second preset delay time.

The present disclosure provides the delay circuit and the delay structure. The delay circuit includes the first delay unit and the second delay unit. The first delay unit delays a rising edge and/or a falling edge of a pulse signal, and outputs a first delay signal. The second delay unit delays on the first delay signal, and outputs a second delay signal. A variation value, varying with at least one of the power supply voltage, working temperature, or manufacturing process, of a rising edge delay time and/or a falling edge delay time of the second delay signal is within a first range, the first range is a small range, so that a delay of an output signal obtained through the delay circuit may have a minor variation with the variation of at least one of the power supply voltage, working temperature, or manufacturing process, and performance of the delay circuit is improved.

It should be noted at last that the above various embodiments are only used to illustrate the technical solutions of the present disclosure and not used to limit the same. Although the present disclosure has been described in detail with reference to the foregoing embodiments, those of ordinary skill in the art should understand that the technical solutions described in the foregoing embodiments may be modified, or part or all of the technical features is equivalently replaced. All these modifications and replacements shall not cause the essence of the corresponding technical solutions to depart from the scope of the technical solutions of the embodiments of the present disclosure.

The invention claimed is:
1. A delay circuit, comprising:
  a first delay circuit, configured to delay at least one of a rising edge or falling edge of a pulse signal, wherein an input terminal of the first delay circuit receives the pulse signal, and an output terminal of the first delay circuit outputs a first delay signal;
  a second delay circuit, configured to delay the first delay signal, wherein an input terminal of the second delay circuit is connected to the output terminal of the first delay circuit, and an output terminal of the second delay circuit outputs a second delay signal; and a feedback loop, wherein a first terminal of the feedback loop is connected to the output terminal of the second delay circuit, and a second terminal of the feedback loop is connected to the input terminal of the second delay circuit, wherein the feedback loop is configured to reduce a time for the first delay signal from a level shift point to a low level or a time for the first delay signal from a level shift point to a high level, wherein a delay time between a rising edge of the second delay signal and the rising edge of the pulse signal is denoted as a rising edge delay time; a delay time between a falling edge of the second delay signal and the falling edge of the pulse signal is denoted as a falling edge delay time; a variation value, varying with a first parameter, of at least one of the rising edge delay time or the falling edge delay time is within a first range, and the first parameter comprises at least one of the following: manufacturing process, power supply voltage wave, or working temperate of the delay circuit.

2. The delay circuit of claim 1, wherein a variation value, varying with the first parameter, of at least one of a charge current or discharge current of the first delay circuit is within the first range; or a variation value, varying with the first parameter, of at least one of a charge current or discharge current of the second delay circuit is within the first range; or a variation value, varying with the first parameter, of at least one of a charge current or discharge current of each of the first delay circuit and the second delay circuit is within the first range.

3. The delay circuit of claim 2, wherein the first delay circuit comprises an inverter and a delay array; or the second delay circuit comprises an inverter and a delay array; or the first delay circuit comprises an inverter and a delay array, and the second delay circuit comprises an inverter and a delay array;

wherein an output terminal of the inverter is connected to an input or output terminal of the delay array, and the inverter has a power supply terminal and a ground terminal; the charge current flows to the delay array from the power supply terminal through the inverter; and the discharge current flows to the ground terminal from the delay array through the inverter.

4. The delay circuit of claim 3, wherein the delay array comprises N delay sub-arrays in parallel connection, first terminals of the N delay sub-arrays serve as the input or output terminal of the delay array, second terminals of the N delay sub-arrays are electrically connected to the ground terminal or the power supply terminal, wherein N is an integer greater than or equal to 2.

5. The delay circuit of claim 4, wherein each delay sub-array comprises a switch and a capacitor, a first terminal of the switch serves as a first terminal or a second terminal of the delay sub-array, a second terminal of the switch is connected to a first terminal of the capacitor, and a second terminal of the capacitor serves as the second terminal or the first terminal of the delay sub-array.

6. The delay circuit of claim 5, wherein an equivalent capacitance value exists between the first terminal and the second terminal of the delay sub-array, and equivalent capacitance values of the N delay sub-arrays are same; the delay array further receives a capacitance value adjusting code, and each bit of the capacitance value adjusting code is configured to control a control terminal of the switch.

7. The delay circuit of claim 5, wherein an equivalent capacitance value exists between the first terminal and the second terminal of the delay sub-array, and equivalent capacitance values of the N delay sub-arrays are set in a form of arithmetic sequence or geometric sequence; the delay array further receives a capacitance value adjusting code, and each bit of the capacitance value adjusting code is configured to control a control terminal of the switch.

8. The delay circuit of claim 3, wherein the inverter comprises a first transistor, a second transistor, and a third transistor; a control terminal of the first transistor is connected to a control terminal of the second transistor, a first terminal of the first transistor is connected to the power supply terminal, a second terminal of the first transistor is connected to a first terminal of the second transistor, a second terminal of the second transistor is connected to a first terminal of the third transistor, a second terminal of the third transistor is connected to the ground terminal, and a control terminal of the third transistor is connected to a bias voltage; the control terminal of the first transistor serves as an input terminal of the inverter, and the second terminal of the first transistor serves as the output terminal of the inverter.

9. The delay circuit of claim 8, wherein the inverter further comprises a fourth transistor; a first terminal of the fourth transistor is connected to the first terminal of the third transistor, a second terminal of the fourth transistor is connected to the ground terminal, and a control terminal of the fourth transistor is connected to the power supply terminal.

10. The delay circuit of claim 8, further comprising:

a voltage bias control circuit, wherein the voltage bias control circuit outputs the bias voltage, and controls, through the bias voltage, the variation value, varying with the first parameter, of at least one of the charge current or discharge current flowing through the inverter to be within the first range.

11. The delay circuit of claim 10, wherein the voltage bias control circuit comprises a constant-current source, a fifth transistor, and a voltage follower;

wherein the constant-current source provides a power supply current, and a variation value, varying with the first parameter, of the power supply current is within the first range;

wherein the constant-current source is connected to a first terminal and a control terminal of the fifth transistor, a second terminal of the fifth transistor is connected to the power supply terminal or the ground terminal, and the control terminal of the fifth transistor provides a reference voltage; and the control terminal of the fifth transistor is further connected to an input terminal of the voltage follower, and an output terminal of the voltage follower serves as an output terminal of the voltage bias control circuit.

12. The delay circuit of claim 3, wherein the inverter comprises a first transistor, a second transistor, and a third transistor; a first terminal of the first transistor is connected to the power supply terminal, a second terminal of the first transistor is connected to a first terminal of the second transistor, a control terminal of the second transistor is connected to a control terminal of the third transistor, a second terminal of the second transistor is connected to a first terminal of the third transistor, a second terminal of the third transistor is connected to the ground terminal, and a control terminal of the first transistor is connected to a bias voltage; the control terminal of the second transistor serves as an input terminal of the inverter, and the second terminal of the first transistor serves as the output terminal of the inverter.

13. The delay circuit of claim 12, wherein the inverter further comprises a fourth transistor; a first terminal of the fourth transistor is connected to the power supply terminal, a second terminal of the fourth transistor is connected to the second terminal of the first transistor, and a control terminal of the fourth transistor is connected to the ground terminal.

14. The delay circuit of claim 3, further comprising:
a buffer, wherein an input terminal of the buffer is connected to the output terminal of the second delay circuit, an output terminal of the buffer outputs a third delay signal, and the buffer is configured to shape the second delay signal to obtain the third delay signal.

15. The delay circuit of claim 1, wherein the feedback loop comprises a seventh transistor and an eighth transistor; a control terminal of the eighth transistor serves as the first terminal of the feedback loop, a first terminal of the eighth transistor is connected to a second terminal of the seventh transistor, a second terminal of the eighth transistor is connected to a ground terminal, a first terminal of the seventh transistor serves as the second terminal of the feedback loop, and a control terminal of the seventh transistor is connected to the input terminal of the first delay circuit.

16. The delay circuit of claim 1, wherein the feedback loop comprises a seventh transistor and an eighth transistor; a control terminal of the seventh transistor serves as the first terminal of the feedback loop, a second terminal of the seventh transistor is connected to a first terminal of the eighth transistor, a first terminal of the seventh transistor is connected to a power supply terminal, a second terminal of the eighth transistor serves as the second terminal of the feedback loop, and a control terminal of the eighth transistor is connected to the input terminal of the first delay circuit.

17. A delay structure, comprising:
a plurality of delay circuits connected in series, wherein each of the plurality of delay circuits comprises:
a first delay circuit, configured to delay at least one of a rising edge or falling edge of a pulse signal, wherein an input terminal of the first delay circuit receives the pulse signal, and an output terminal of the first delay circuit outputs a first delay signal;
a second delay circuit, configured to delay the first delay signal, wherein an input terminal of the second delay circuit is connected to the output terminal of the first delay circuit, and an output terminal of the second delay circuit outputs a second delay signal; and
a feedback loop, wherein a first terminal of the feedback loop is connected to the output terminal of the second delay circuit, and a second terminal of the feedback loop is connected to the input terminal of the second delay circuit, wherein the feedback loop is configured to reduce a time for the first delay signal from a level shift point to a low level or a time for the first delay signal from a level shift point to a high level,
wherein a delay time between a rising edge of the second delay signal and the rising edge of the pulse signal is denoted as a rising edge delay time; a delay time between a falling edge of the second delay signal and the falling edge of the pulse signal is denoted as a falling edge delay time; a variation value, varying with a first parameter, of at least one of the rising edge delay time or the falling edge delay time is within a first range, and the first parameter comprises at least one of the following: manufacturing process, power supply voltage wave, or working temperate of the delay circuit;
wherein an input terminal of a first one of the delay circuits receives the pulse signal, an output terminal of an $(M-1)^{th}$ one of the delay circuits is connected to an input terminal of an $M^{th}$ one of the delay circuits, and an output terminal of the $M^{th}$ one of the delay circuits outputs a delay signal with a preset delay time, wherein M is an integer greater than or equal to 2.

18. The delay structure of claim 17, wherein a delay time between a rising edge of the delay signal with the preset delay time and the rising edge of the pulse signal is denoted as a first preset delay time; a delay time between a falling edge of the delay signal with the preset delay time and the falling edge of the pulse signal is denoted as a second preset delay time; a variation value, varying with the first parameter, of at least one of the first preset delay time or the second preset delay time is within the first range.

19. The delay structure of claim 18, further comprising:
a control encoding component, connected to the delay circuit and configured to control a magnitude of at least one of the first preset delay time or the second preset delay time.

* * * * *